United States Patent
Hol et al.

(10) Patent No.: US 9,172,294 B2
(45) Date of Patent: Oct. 27, 2015

(54) PLANAR MOTOR AND LITHOGRAPHIC APPARATUS COMPRISING SUCH PLANAR MOTOR

(75) Inventors: Sven Antoin Johan Hol, Eindhoven (NL); Edwin Johan Buis, Belfeld (NL); Erwin Wijn, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 294 days.

(21) Appl. No.: 13/428,447

(22) Filed: Mar. 23, 2012

(65) Prior Publication Data

US 2012/0249991 A1 Oct. 4, 2012

Related U.S. Application Data

(60) Provisional application No. 61/469,516, filed on Mar. 30, 2011.

(51) Int. Cl.
*G03B 27/58* (2006.01)
*H02K 41/03* (2006.01)
*G03F 7/20* (2006.01)

(52) U.S. Cl.
CPC .......... *H02K 41/033* (2013.01); *G03F 7/70758* (2013.01)

(58) Field of Classification Search
CPC .................. G03F 7/70758; H02K 41/033
USPC .......................... 355/72; 310/12.06
See application file for complete search history.

(56) References Cited

U.S. PATENT DOCUMENTS

| | | | |
|---|---|---|---|
| 3,906,262 A * | 9/1975 | Shichida et al. | 310/12.05 |
| 4,761,574 A * | 8/1988 | Nakagawa | 310/12.27 |
| 5,032,747 A * | 7/1991 | Sakamoto | 310/49.44 |
| 5,179,304 A * | 1/1993 | Kenjo et al. | 310/12.27 |
| 6,522,035 B1 * | 2/2003 | Smit | 310/12.18 |
| 6,798,089 B1 | 9/2004 | Smit | |

(Continued)

FOREIGN PATENT DOCUMENTS

| | | |
|---|---|---|
| CN | 1777003 | 5/2006 |
| JP | 04-165952 | 6/1992 |

(Continued)

OTHER PUBLICATIONS

Japanese Office Action dated Sep. 9, 2014 in corresponding Japanese Patent Application No. 2012-060216.

(Continued)

*Primary Examiner* — Deoram Persaud
(74) *Attorney, Agent, or Firm* — Pillsbury Winthrop Shaw Pittman LLP

(57) ABSTRACT

A motor includes a stator including a plurality of stator poles arranged in a repetitive arrangement with a first pitch, the stator poles facing a first side of a plane of movement, and a mover including a plurality of mover poles arranged in a repetitive arrangement with a second pitch, the mover poles facing a second, opposite side of the plane of movement. The poles of the stator and/or the mover are provided with a winding to alter a magnetic field in the respective ones of the stator poles and the mover poles in response to an electric current through the respective winding. At least one of the stator and the mover includes a permanent magnet for generating a magnetic field extending from the permanent magnet via at least one respective pole of the stator and the mover to the other one of the stator and the mover and back.

19 Claims, 3 Drawing Sheets

(56) References Cited

U.S. PATENT DOCUMENTS

| | | |
|---|---|---|
| 6,836,315 B2 | 12/2004 | Roes |
| 7,952,237 B2 | 5/2011 | Matscheko et al. |
| 8,076,804 B2 * | 12/2011 | Jajtic et al. ............... 310/12.19 |
| 2004/0016891 A1 | 1/2004 | Roes |
| 2006/0131967 A1 * | 6/2006 | Lin et al. ........................ 310/12 |
| 2008/0265689 A1 | 10/2008 | Armeit et al. |
| 2009/0268191 A1 * | 10/2009 | Sato ............................... 355/72 |
| 2009/0315413 A1 | 12/2009 | Iwatani et al. |

FOREIGN PATENT DOCUMENTS

| | | |
|---|---|---|
| JP | 11-262236 | 9/1999 |
| JP | 2003-534761 | 11/2003 |
| JP | 2004-047981 | 2/2004 |
| JP | 2004-140899 | 5/2004 |
| JP | 2005-326955 | 11/2005 |
| JP | 2006-149051 | 6/2006 |
| JP | 2008-022700 | 1/2008 |
| JP | 2008-527964 | 7/2008 |
| JP | 2009-136056 | 6/2009 |
| JP | 2009-136065 | 6/2009 |
| JP | 2011-503529 | 1/2011 |
| KR | 10-2009-0132547 | 12/2009 |

OTHER PUBLICATIONS

Chinese Office Action dated Aug. 5, 2014 in corresponding Chinese Patent Application No. 201210082387.0.

* cited by examiner

PLANAR MOTOR AND LITHOGRAPHIC APPARATUS COMPRISING SUCH PLANAR MOTOR

CROSS REFERENCE TO RELATED APPLICATIONS

This application claims priority and benefit under 35 U.S.C. §119(e) to U.S. Provisional Patent Application Ser. No. 61/469,516, entitled "Planar Motor and Lithographic Apparatus Comprising Such Planar Motor", filed on Mar. 30, 2011, the content of which is incorporated herein in its entirety by reference.

FIELD

The present invention relates to a planar motor and to a lithographic apparatus comprising such a planar motor.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, high power electric motors, such as planar motors are used, for example to enable a substrate table that holds the substrate, or a support that holds a pattering device, to be moved. On the one hand, the high accelerations require powerful motors. On the other hand, powerful motors involve a high weight of a moving part, which adversely affects a maximum acceleration to be achieved due to the higher mass of the structure to be moved. Furthermore, compliance plays a role. In case a plurality of motor units are applied, for example a motor unit to propel in an x direction and a motor unit to propel in an y direction, a compliance of a structure that interconnects the motor units may limit a maximum bandwidth and dynamic performance of movements to be achieved.

SUMMARY

It is desirable to provide a planar motor that enables to provide high a acceleration and a high bandwidth.

According to an embodiment of the invention, there is provided a lithographic apparatus provided with a planar motor comprising:
a stator comprising a plurality of stator poles arranged in a repetitive arrangement with a first pitch, the plurality of stator poles facing a first side of a plane of movement, a mover comprising a plurality of mover poles arranged in a repetitive arrangement with a second pitch, the plurality of mover poles facing a second, opposite side of the plane of movement,
wherein the poles of at least one of the stator and the mover are provided with a winding so as to alter a magnetic field in the respective ones of the stator poles and the mover poles in response to an electric current through the respective winding,
wherein at least one of the stator and the mover comprises a permanent magnet for generating a magnetic field extending from the permanent magnet via at least one respective pole of the stator and the mover to the other one of the stator and the mover and back,
wherein the first pitch and the second pitch are distinct from each other, so that when one of the mover poles of the mover is aligned with one of the stator poles of the stator, the other mover poles of the mover are unaligned with the stator poles of the stator.

In another embodiment of the invention, there is provided an illumination system configured to condition a radiation beam;
a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate,
wherein the lithographic apparatus comprises a planar motor according to various embodiments of the invention, the planar motor being a drive motor of one of the support and the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
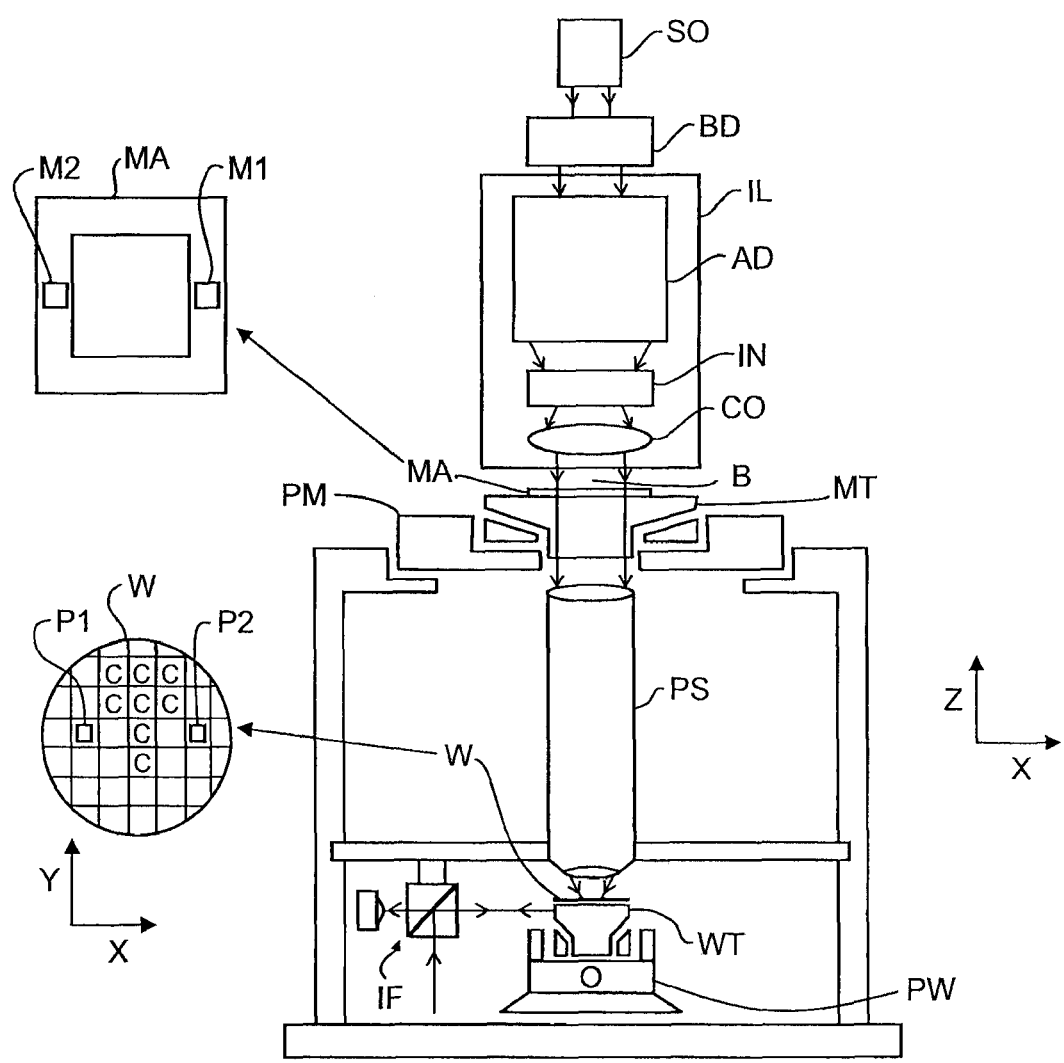
FIG. 1 depicts a lithographic apparatus according to in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or patterning device support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
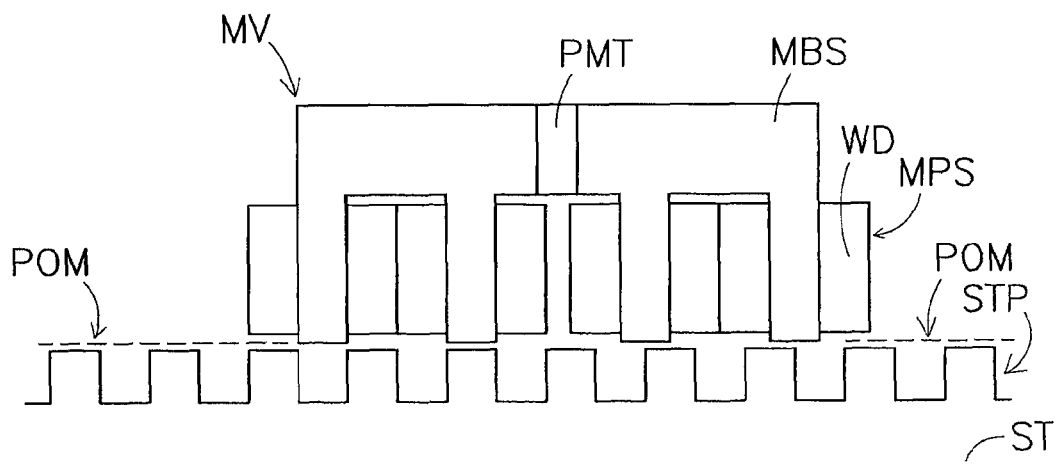
FIG. 2 depicts a schematic side view of a planar motor according to an embodiment of the invention.

FIG. 2 depicts a schematic side view of a planar motor according to an embodiment of the invention. The planar motor comprises a stator ST having a repetitive arrangement of stator poles STP at a first pitch. The stator poles STP extend along a plane of movement POM and may be made of a ferro-magnetic material (or ferri-magnetic material), such as iron or of a composition containing such ferro-magnetic or ferri-magnetic material, such a as composition containing an iron powder. The planar motor further comprises a mover MV which is movable in respect of the stator ST along a plane of movement POM. The stator poles STP extend towards a first side of the plane of movement. The mover poles extend towards the opposite side of the plane of movement. A permanent magnet PMT is provided (in this example in the mover, although a permanent magnet in the stator could be applied also). The permanent magnet is in this example, (wherein 4 mover poles are provided) arranged in a mover base MBS that connects to each of the mover poles MPS, at a center location, so that on either side of the permanent magnet PMT two mover poles MPS connect to the mover base MBS. The mover poles of the mover are hence all connected to the mover base MBS, the mover base being formed of a material capable of conducting magnetic flux, such as iron and/or a permanent magnet, such as in this example the permanent magnet PMT. Windings WD (e.g. coils) are provided around each of the mover poles. Alternatively, windings could be provided around the stator poles. As can be seen in FIG. 2, in the position as depicted, seen from the left, a second one of the mover poles faces one of the stator poles, in other words is in phase with that stator pole. The first mover poles, seen from the left, are out of phase to some degree in respect of the repetitive pattern of stator poles: In the depicted position, the first mover pole seen from the left is 180 degrees out of phase, while the third and fourth mover poles are 270 and 90 degrees out of phase respectively. In this position, the magnetic field from the permanent magnet PMT extends via the second one of the mover poles to the stator ST and from the stator via the third and fourth mover poles and the corresponding stator poles back to the permanent magnet of the mover. Given that the overlap of the third and fourth mover poles with the corresponding stator poles is substantially the same, a substantially equal magnetic field flows (as long as the windings are not powered) through the third and fourth mover poles. When one or more of the windings WD are powered by a respective electric current, a force may be generated: powering the windings of the third and fourth mover poles, e.g. with opposite directed currents, will increase the magnetic field in one of the third and fourth mover poles and decrease the magnetic field in the other one, whereby a force is generated (depending on the direction of the currents) towards the left or towards the right. As the mover MV moves, overlap of the mover poles with the stator poles changes: as an example, when moving to the left, overlap of the first mover pole increases, overlap of the second mover pole decreases, overlap of the third mover pole decreases and overlap of the fourth mover pole increases. As a result, the magnetic field "redistributes" itself, whereby the mover poles of which the overlap decreases, tend to get a reduced field strength, and vice versa. As the mover moves, the powering of the windings is changed. The windings are in this embodiment commutated as a function of the position of the mover in respect of the stator, more precisely as a function of the phase of the mover in respect of the repetitive pattern of the stator poles. As a result, an efficient planar motor may be provided that allows to generate a high motor force in combination with a low weight of the mover, so that high accelerations may be generated.

In order to provide a similar behavior of the planar motor over the stator, the stator poles may be provided at a constant pitch. In the depicted example, 4 mover poles are provided, allowing an efficient configuration providing a low force ripple, high force and low mover mass. The same principle may be applied with other number of mover poles, although a minimum of 3 mover poles may be desired. A pitch of the mover poles differs from the pitch of the stator poles, so that upon movement of the mover along the plane of movement, the mover poles turn by turn face a corresponding stator pole, allowing to generate a force at each position of the mover along the plane of movement, relative to the stator. Thus, when moving the mover, the mover poles are turn by turn aligned with (i.e. facing) a stator pole. An effective arrangement allowing a relatively ripple free, hence relatively constant force, may be provided when the mover poles are arranged to be located at a phase difference of 360 degrees divided by the number of poles of the mover. Thus, in case of 4 mover poles a phase difference of 90 degrees between mover poles is provided. Such a phase difference of 90 degrees can be seen in the embodiment depicted in FIG. 2: In the depicted position of the mover, the mover poles are in a phase relation ship of 180, 0, 90 and 270 degrees (or 180, 0, 270 and 90 degrees depending on definition) in respect of the stator poles. Other pitches of the mover poles may be provided, for example so as to provide a phase relationship of 0, 180, 90 and 270 degrees. In these examples, the following relation is fulfilled: a pitch of the left pair of poles of the mover is set to N+½ times the pitch of the stator poles (N being an integer: 0, 1, 2, . . . ), a pitch of the right pair of poles of the mover being set likewise to N+½ times the pitch of the stator poles (N being an integer: 0, 1, 2, . . . ), and a pitch of the left pair in respect of the right pair being set to N+¼ or N+¾ times the pitch of the stator poles (N being an integer: 0, 1, 2, . . . ).

In this document, the pitch of the stator poles may be referred to as a first pitch and the pitch of the mover poles may be referred to as a second pitch. The term pitch of the poles is to be understood as a distance between a centre of two adjacent poles (or a distance between respective left edges of two adjacent poles or a distance between respective right edges of two adjacent poles, etc.).

Furthermore, as can be seen in FIG. 2, in this embodiment, the pitch of the mover poles is pairwise constant: the pitch of the left pair of poles is the same as the pitch of the right pair of poles. The pitch of the left pair and right pair is set to provide a 180 degrees mutual phase difference in respect of the stator pole pattern, while a phase shift of 90 degrees (or 270 degrees) is provided between the left and right pair.

In the embodiment depicted in FIG. 2, the mover comprises the permanent magnet and the windings, so that a minimum number of permanent magnets (1) and a minimum number of windings (4) is needed.

A spacing between the stator poles may be filled with a non-magnetic material, so as to obtain a flat surface, the mover to move over such flat surface, for example using an air bearing. The non-magnetic material may be enamel.

In order to drive the windings, a drive arrangement may be provided to commutate the coils as a function of a position of the mover in respect of the stator. A position sensor may be provided to measure a position of the mover, the drive arrangement thereby being arranged to drive the windings in response to the measured position from the position sensor. A block signal type commutation of the windings may be applied. A low force ripple and low vibration may be obtained when the drive arrangement commutates the coils with a substantially sine shaped current.

Figure 3:
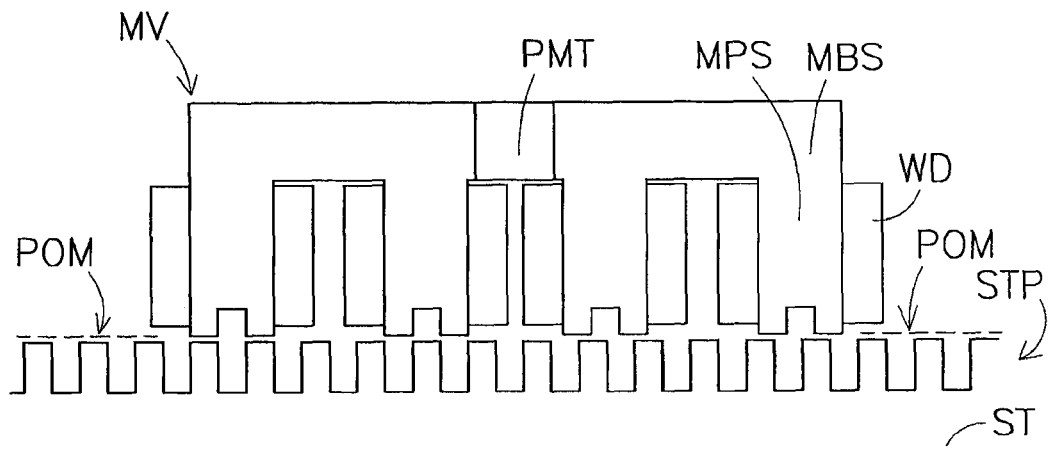
FIG. 3 depicts a schematic side view of a planar motor according to an embodiment of the invention.
Figure 4:
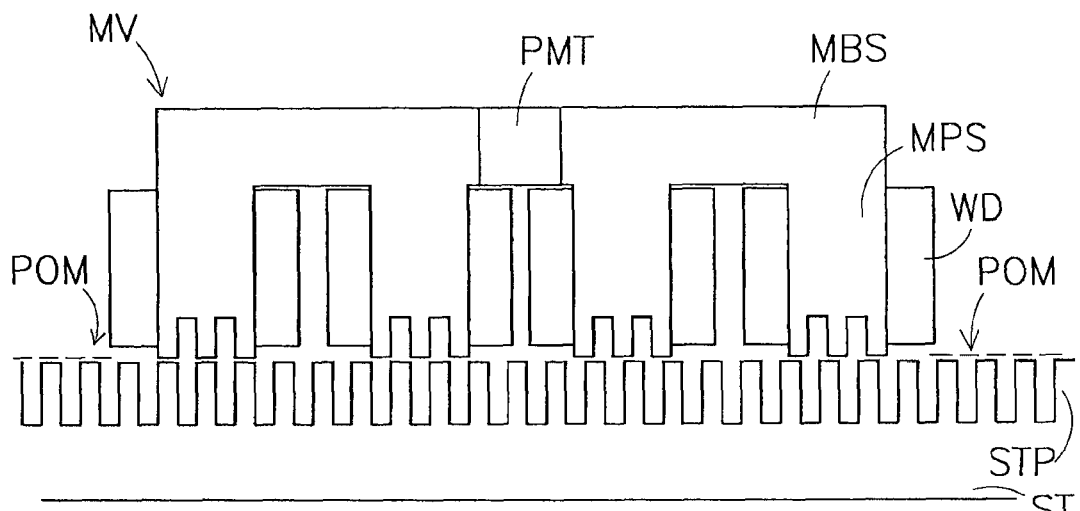
FIG. 4 depicts a schematic side view of a planar motor according to an embodiment of the invention.

FIG. 3 depicts an embodiment which is similar to that of FIG. 2, however each of the poles of the stator and each of the poles of the mover are double slotted. This means that each pole (e.g. each of the poles shown in FIG. 2) is divided into two smaller poles. A similar, triple slotted arrangement whereby each of the poles of the stator and each of the poles of the mover are triple slotted, is depicted in FIG. 4. Hence, each pole is divided into three smaller poles. Thereby, a higher d(phi)/dx or delta(phi)/delta(x) may be generated, and hence a higher force, however on the other hand a total flux may be reduced.

Figure 5:
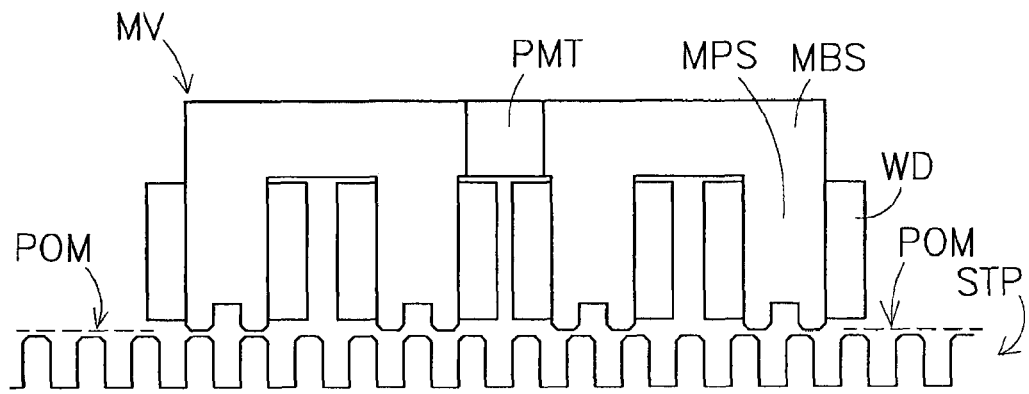
FIG. 5 depicts a schematic side view of a planar motor according to an embodiment of the invention.

A further embodiment is depicted in FIG. 5, showing an arrangement similar to that of FIG. 3, whereby the stator poles and the mover poles are provided with tapered edges. As a result, an improved "circulation" of the magnetic flux may be achieved and therefore a higher force density. It is noted that, although FIG. 5 depicts tapered edges in a configuration with double slotted poles, the tapered edges may be provided likewise in a configuration with single slotted poles such as depicted in FIG. 2 or with triple slotted poles as depicted in FIG. 4.

Figure 6:
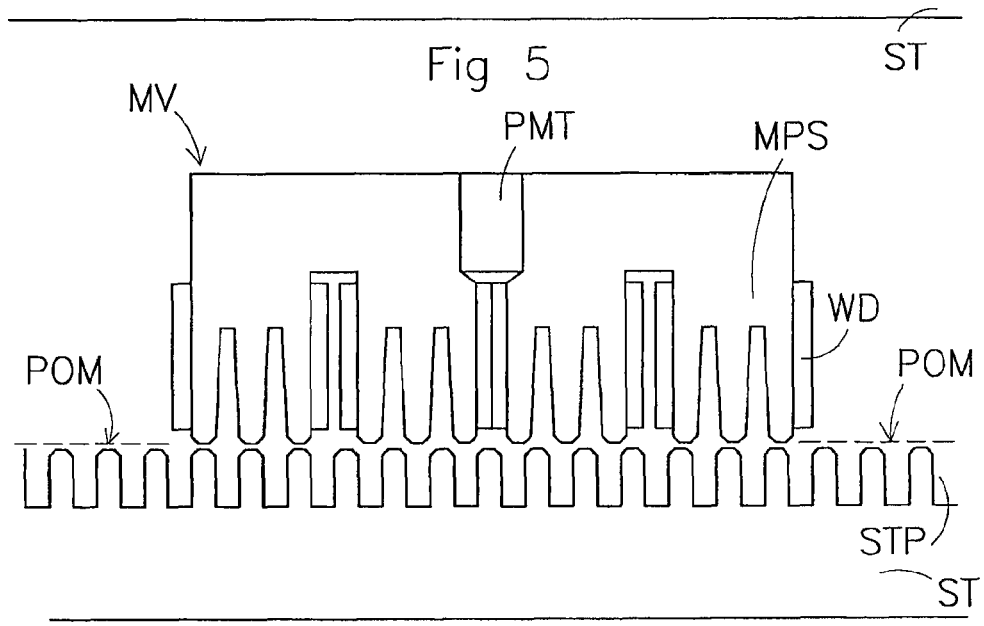
FIG. 6 depicts a schematic side view of a planar motor according to an embodiment of the invention.

FIG. 6 shows a still further embodiment whereby the mover poles are tapered towards the plane of movement. It is noted that the stator poles may also be tapered. As magnetic field line density away from the plane of movement may be slightly more dense, the lightly wider pole allows to carry such higher density without saturation. The tapered poles hence allow a high magnetic field, and thus a high force, at an optimum use of material, hence at an optimum weight.

It is noted that the stator pattern as depicted in FIGS. 2-6 are one dimensional. However, a two dimensional pattern may be provided extending along the plane of movement, allowing to provide a two dimensional planar motor, as will be explained in more detail below.

Figures 7, 8:
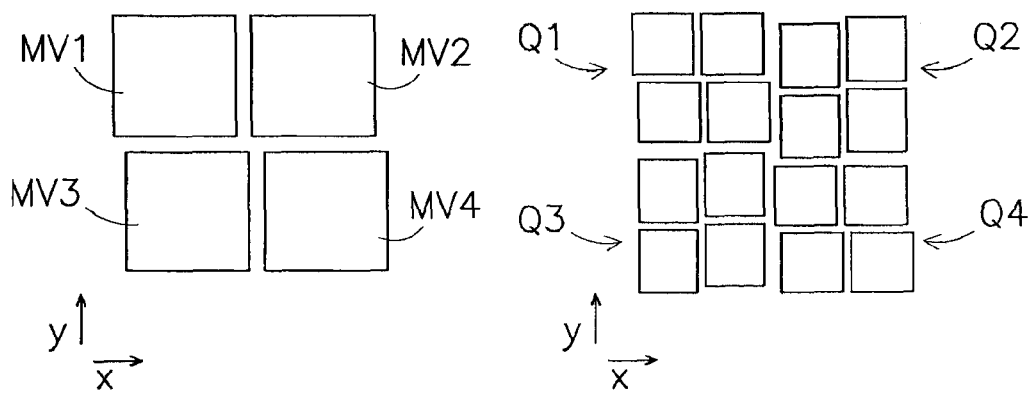
FIG. 7 depicts a schematic top view of a planar motor according to an embodiment of the invention.
FIG. 8 depicts a schematic top view of a planar motor according to an embodiment of the invention.

When using a single mover, such as depicted in FIGS. 2-6 and described above, a force ripple may occur when the mover moves along the stator, the force ripple having a periodicity related to the pitch of stator and/or mover. Such force ripple may at least partly be compensated as will be explained with reference to FIG. 7. FIG. 7 depicts a highly schematic top view of a plurality of movers MV1, MV2, MV3 and MV4 of a planar motor. The movers MV1-MV4 are mechanically interconnected so as to move as a single unit. Movers MV1 and MV2 are displaced in respect of each other in the x direction and are constructed to generate a force in the x-direction.

Movers MV1-MV4 may be horizontally constrained with respect to each other. Movers MV1-MV4 may be vertically constrained by the stator ST. Each mover M1-M4 may be supported with an airbearing for which the stator ST provides a bearing surface. Movers M1-M4 may each be supported by an airbearing separately, such that each mover M1-M4 can be optimally aligned with the stator ST. The air gap between the movers M1-M4 and the stator ST is minimized this way, resulting in an improved motor performance. In an embodiment, movers M1-M4 may be connected to each other with flexible hinges that are flexible in vertical directions and stiff in horizontal directions.

The offset between the movers MV1 and MV2 is set such that their force ripples are substantially 180 degrees out of phase. Thereto, the distance between the movers MV1 and MV2 is set to the stator pitch divided by the number of poles of each mover plus an offset so as to get the force ripple of the movers substantially 180 degrees out of phase, the offset being substantially equal to half the stator pitch divided by the number of poles of the mover.

As during operation of the planar motor, the movement of the mover results in a change of the point of application of the motor force, namely between the mover poles, a torque ripple may occur during movement of the mover of the motor. Such torque ripple may at least partly be compensated by a second pair of movers, namely the third and fourth movers MV3 and MV4. MV3 and MV4 are displaced in respect of MV1 and MV2 respectively, in the Y direction. Also, MV3 is offset in respect of MV1 in x direction and similarly, MV4 is offset in respect of MV2 in x direction. This offset is chosen so as to provide that the torque ripple of movers MV3 and MV4 is substantially 180 out of phase in respect of the torque ripple of movers MV1 and MV2. Thereto, the offset in the x direction (i.e. in the direction of the motor force) between MV1 and MV3, respectively between MV2 and MV4 is set to a half of the stator pitch. Hence, with the quadrant of 4 interconnected movers, force ripple and torque ripple may at least partly be compensated for the one directional motor, in this example the x direction motor.

A planar motor that allows propelling in x and y direction, i.e. in two directions along the plane of movement, will be described with reference to FIG. 8. FIG. 8 depicts a highly schematic top view of a mover assembly of a planar motor. Four quadrants Q1-Q4 of movers are provided, each quadrant in turn comprising four movers. The movers of quadrant Q1 and Q4 correspond to the quadrant of movers described with reference to FIG. 7 and allow to generate a force in the x direction. The movers of quadrants Q2 and Q3 also correspond to the movers of the quadrant described with reference to FIG. 7, however turned 90 degrees in the plane of movement, so that they are arranged to provide a force in the y direction. Hence, the combination of 4 quadrants of movers allows to provide a 2 dimensional planar motor having the force ripple and torque ripple reduction described above. A less complex planar motor could, instead of the four quadrants of each 4 movers, be provided with 4 movers, two in x direction and two in y direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus provided with a planar motor comprising:
    a stator comprising a plurality of stator poles arranged in a repetitive arrangement with a first pitch, the plurality of stator poles facing a first side of a plane of movement,
    a mover comprising a plurality of mover poles arranged in a repetitive arrangement with a second pitch, the plurality of mover poles facing a second, opposite side of the plane of movement,
    wherein each of the poles of at least one of the stator and the mover is provided with a separate winding so as to alter a magnetic field in the respective ones of the stator poles and the mover poles in response to an electric current through the respective winding,
    wherein at least one of the stator and the mover comprises a permanent magnet configured to generate a magnetic field extending from the permanent magnet via at least one respective pole of the stator and the mover to the other one of the stator and the mover and back,
    wherein the first pitch and the second pitch are distinct from each other, so that when one of the mover poles of the mover is aligned with one of the stator poles of the stator, the other mover poles of the mover are unaligned with the stator poles of the stator, and
    wherein a side of each of the plurality of mover poles and stator poles that faces the plane of movement has a tapered edge that is tapered towards the plane of movement.

2. The lithographic apparatus according to claim 1, wherein the stator poles and mover poles are at least double slotted.

3. The lithographic apparatus according to claim 1, wherein the mover comprises at least three mover poles.

4. The lithographic apparatus according to claim 1, wherein the mover comprises four mover poles.

5. The lithographic apparatus according to claim 4, wherein the first pitch is a constant pitch and the second pitch is pair-wise constant.

6. The lithographic apparatus according to claim 1, wherein the mover comprises the permanent magnet and the windings.

7. The lithographic apparatus according to claim 1, wherein a spacing between the stator poles is filled with non-magnetically conductive material.

8. The lithographic apparatus according to claim 1, comprising a drive arrangement to drive the coils, wherein the drive arrangement is constructed to commutate the coils as a function of a position of the mover in respect of the stator.

9. The lithographic apparatus according to claim 8, wherein the drive arrangement is arranged to commutate the coils with a substantially sine shaped electric current.

10. The lithographic apparatus according to claim 1, wherein the stator poles and the mover poles consist of a ferro-magnetic or ferri-magnetic material.

11. The lithographic apparatus according to claim 1, wherein the planar motor comprises a first pair of movers constructed to generate a force in substantially a same, first direction substantially parallel to the plane of movement, the first pair of movers being mechanically connected to each other and the movers of the first pair being offset in the plane of movement substantially 180 degrees out of phase in respect of each other in respect of a force ripple as a function of a position of the respective mover of the first pair.

12. The lithographic apparatus according to claim 11, wherein an offset between the movers of the first pair substantially equals the first pitch divided by 2N, wherein N represents the number of poles of each of the movers.

13. The lithographic apparatus according to claim 1, wherein the planar motor comprises the first pair of movers and a second pair of movers arranged in the plane of movement, the movers of the first and second pair being mechanically connected to each other and positioned along the plane of movement substantially in a quadrant arrangement, whereby the movers of the first pair and the movers of the second pair are offset substantially 180 degrees out of phase in respect of each other in the first direction and in respect of a torque ripple by a motor force point of action of the movers as a function of a position of the movers.

14. The lithographic apparatus according to claim 13, wherein an offset between the movers of the first part and the movers of the second pair substantially equals a half of the first pitch.

15. The lithographic apparatus according to claim 1, comprising:
a support constructed to support a patterning device, the patterning device being capable of imparting a radiation beam with a pattern in its cross-section to form a patterned radiation beam;
a substrate table constructed to hold a substrate; and
a projection system configured to project the patterned radiation beam onto a target portion of the substrate,
wherein the planar motor is a drive motor of one of the support and the substrate table.

16. A lithographic apparatus provided with a planar motor comprising:
a stator comprising a plurality of stator poles arranged in a repetitive arrangement with a first pitch, the plurality of stator poles facing a first side of a plane of movement,
a mover comprising a plurality of mover poles arranged in a repetitive arrangement with a second pitch, the plurality of mover poles facing a second, opposite side of the plane of movement,
wherein the poles of at least one of the stator and the mover are provided with a winding so as to alter a magnetic field in the respective ones of the stator poles and the mover poles in response to an electric current through the respective winding,
wherein at least one of the stator and the mover comprises a permanent magnet configured to generate a magnetic field extending from the permanent magnet via at least one respective pole of the stator and the mover to the other one of the stator and the mover and back,
wherein the first pitch and the second pitch are distinct from each other, so that when one of the mover poles of the mover is aligned with one of the stator poles of the stator, the other mover poles of the mover are unaligned with the stator poles of the stator,
wherein the first pitch is a constant pitch and the second pitch is set so that the mover poles are located at a phase difference of 360 degrees/N with respect to the repetitive arrangement of the stator poles, whereby N equals a number of mover poles of the mover, and
wherein a side of each of the plurality of mover poles and stator poles that faces the plane of movement has a tapered edge that is tapered towards the plane of movement.

17. A lithographic apparatus provided with a planar motor comprising:
a stator comprising a plurality of stator poles arranged in a repetitive arrangement with a first pitch, the plurality of stator poles facing a first side of a plane of movement,
a first mover comprising a plurality of mover poles arranged in a repetitive arrangement with a second pitch, the plurality of mover poles facing a second, opposite side of the plane of movement,
wherein each of the poles of at least one of the stator and the first mover is provided with a separate winding so as to alter a magnetic field in the respective ones of the stator poles and the mover poles in response to an electric current through the respective winding,
wherein at least one of the stator and the first mover comprises a permanent magnet configured to generate a magnetic field extending from the permanent magnet via at least one respective pole of the stator and the first mover to the other one of the stator and the mover and back,
wherein the first pitch and the second pitch are distinct from each other, so that when one of the mover poles of the first mover is aligned with one of the stator poles of the stator, the other mover poles of the first mover are unaligned with the stator poles of the stator,
wherein a side of each of the plurality of mover poles and stator poles that faces the plane of movement has a tapered edge that is tapered towards the plane of movement, and
wherein the planar motor comprises a second mover to form with the first mover a first pair of movers constructed to generate a force in substantially a same, first direction substantially parallel to the plane of movement, the first pair of movers being mechanically connected to each other and the first and second movers of the first pair being substantially aligned along the first direction and being offset in the plane of movement substantially 180 degrees out of phase in respect of each other in respect of a force ripple as a function of a position of the respective mover of the first pair.

18. The lithographic apparatus according to claim 17, wherein each of the first and second movers is supported by a separate airbearing.

19. The lithographic apparatus according to claim 17, further comprising a second pair of movers spaced apart from the first pair of movers along a second direction substantially perpendicular to the first direction, the second pair of movers including a third and a fourth mover that are at a respective position along the first direction that is offset with respect to a respective position of the first and the second mover.

* * * * *